United States Patent [19]
Marz

[11] Patent Number: 5,371,902
[45] Date of Patent: Dec. 6, 1994

[54] METHOD AND APPARATUS FOR RECOVERING BASEBAND SIGNALS FROM IN-PHASE AND QUADRATURE-PHASE SIGNAL COMPONENTS HAVING PHASE ERROR THEREBETWEEN

[75] Inventor: Daniel Marz, Feasteville, Pa.

[73] Assignee: General Instrument Corporation

[21] Appl. No.: 765,283

[22] Filed: Sep. 25, 1991

[51] Int. Cl.$^5$ .............................................. H04B 1/16
[52] U.S. Cl. .................. 455/304; 455/196.1; 455/260; 455/318; 455/324
[58] Field of Search ............ 455/196.1, 189.1, 208, 455/209, 255, 258, 265, 304, 315, 316, 318, 319, 260, 324; 329/325; 375/97

[56] References Cited

U.S. PATENT DOCUMENTS

| | | | |
|---|---|---|---|
| 3,806,815 | 4/1974 | Fletcher et al. | 455/260 |
| 4,682,117 | 7/1987 | Gibson | 455/214 |
| 4,910,799 | 3/1990 | Takayama | 455/304 |
| 4,953,182 | 8/1990 | Chung | 455/260 |
| 4,979,230 | 12/1990 | Marz | 455/3 |

Primary Examiner—Reinhard J. Eisenzopf
Assistant Examiner—Chi Pham
Attorney, Agent, or Firm—Hopgood, Calimafde, Kalil & Judlowe

[57] ABSTRACT

A method and apparatus are provided for recovering a desired baseband signal from a signal represented by in-phase and quadrature-phase signal components, while automatically correcting phase error present between these signal components. In general, the method of the present invention involves providing to the input of a local signal generating circuit, a first signal representative of the in-phase signal component, and generating therefrom local in-phase and quadrature-phase signals. One of the local in-phase and quadrature-phase signals is phase shifted by a selected amount of phase correction. The local in-phase signal is multiplied by the first signal to produce a first resultant signal. The local quadrature-phase signal is multiplied by the second signal representative of the quadrature-phase signal, to produce a second resultant signal. The first resultant signal and the second resultant signal are then summed so as to produce an output signal representative of the desired baseband signal.

21 Claims, 4 Drawing Sheets

METHOD AND APPARATUS FOR RECOVERING BASEBAND SIGNALS FROM IN-PHASE AND QUADRATURE-PHASE SIGNAL COMPONENTS HAVING PHASE ERROR THEREBETWEEN

BACKGROUND OF THE INVENTION

1. Field of Invention

In general, the present invention relates to homodyne detectors, in which a received carrier signal is mixed with locally generated in-phase and quadrature phase signals each having the same frequency as the carrier signal, in order to produce an in-phase (I) and quadrature-phase (Q) output signal components carrying a desired baseband signal. More particularly, the present invention relates to a method and apparatus for recovering the desired baseband signals from the in-phase and quadrature-phase signal components, while correcting for phase error present between these input signal components.

2. Brief Description of the Prior Art

Homodyne receivers for use in cable television converters are generally known in the art. U.S. Pat. No. 4,979,230 to applicant, incorporated herein by reference, discloses one such receiver. For purposes of illustration, this receiver is shown in FIG. 1.

As illustrated in FIG. 1, receiver 1 comprises a number of components. In particular, a filter and amplifier 2 are provided for filtering and amplifying an input signal 3 such as a vestigial side-band (VSB) television picture signal. The filtered and amplified input signal is then mixed at mixer 4 with the output of a tunable oscillator 5. This mixing process translates the frequency spectrum of the VSB input signal to a frequency band above that of the incoming signal. In this way, tuning over a range of 500 MHz (e.g. 50–550 MHz) in cable television applications is greatly simplified using a simple local oscillator. An intermediate frequency (IF) filter 6 then receives the upconverted spectrum from mixer 5 and attenuates most of the undesired spectrum, passing a single channel signal to homodyne mixer circuit 7.

At homodyne mixing circuit 7, a signal splitter 8 splits the desired upconverted channel signal into two portions. The first signal portion 9 is applied as input to mixer 10 and the second signal portion 11 is applied as input to mixer 12. A local oscillator 13 generates a fixed local carrier signal having a frequency which is offset to approximately the middle of the desired channel band, which in cable television applications is selected to be 2.15 MHz. This condition avoids distortion due to adjacent channel interference upon homodyne mixing. The local carrier signal from local oscillator 13 is provided to mixer 10 so as to mix with the first signal portion 10 and produce an in-phase output (I) signal component. Also, the local carrier signal output from local oscillator 13 is phase shifted by 90° and provided to mixer 12 so as to mix with second signal portion 11 and produce a quadrature-phase output (Q) signal component. Notably, both of these signal components carrying the desired baseband signal, are then provided as input to a signal processor 14 for recovery of the original video signal. With such homodyne frequency conversion, a very low intermediate frequency (i.e. 2.15 MHz) is provided, permitting the use of conventional digital technology in subsequent signal processing in processor 14. The recovered baseband video signal is then provided as output to a television receiver or the like.

As illustrated, the I and Q signal components can be each provided to an analog-to-digital (A/D) converter 15 and 16, respectively, to convert these signals into a digital format. The digitized signals from A/D converters 15 and 16 can be expressed as $V\sin(\beta)$ and $V\cos(\beta)$, respectively, where $\beta = (\Omega_{LO} - \Omega_c)t$, $\Omega_{LO}$ is the frequency of the local oscillator 13, and $\Omega_c$ is the intermediate frequency. The I signal component, $V\sin(\beta)$, is passed through a low-pass filter 17 which is tuned to $\beta = 2.15$ MHz in cable television applications. The output of low-pass filter 17 is coupled to the input of a digital phase lock loop circuit 18 that precisely locks onto the incoming 2.15 MHz signal and generates 0° and 90° components (i.e. local in-phase and quadrature-phase components) corresponding to $\sin\beta$ and $\cos(\beta)$. The $\sin(\beta)$ signal component is multiplied in a first mixer 19 with the $V\sin(\beta)$ signal component to produce a first product signal $V\sin^2(\beta)$. Similarly, the $\cos(\beta)$ component is multiplied in a second mixer 20 with the $V\cos(\beta)$ signal component to produce a second product signal $V\cos^2(\beta)$. Then, when signal components $V\sin^2(\beta)$ and $V\cos^2(\beta)$ are added together in summing circuit 21, the resultant output on terminal 22 is the recovered desired baseband signal V.

While the above-described signal processor is capable of recovering baseband signals, it is, however, highly sensitive to phase error present between the in-phase and quadrature-phase signal components produced in the system. Consequently, such phase error typically results in unacceptable distortion of the recovered baseband signal.

Accordingly, it is a primary object of the present invention to provide a method and apparatus for recovering a desired baseband signal from a detected signal having in-phase and quadrature-phase signal components, while automatically correcting for phase error present between these signal components.

Another object of the present invention is to provide such a method and apparatus, in which the phase error between the in-phase and quadrature-phase signal components is automatically corrected by introducing a predetermined amount of phase correction in one of the in-phase and quadrature-phase signal components.

Another object of the present invention is to provide such a method and apparatus, in which the selected amount of introduced phase correction is derived on the basis of sensed signals processed in real-time according to a trigonometric relation involving the sensed signals.

Another object of the present invention is to provide such apparatus in the form of a quadrature demodulation circuit having automatic phase-error correction capabilities.

Yet another object of the present invention is to provide such a quadrature demodulation circuit which is particularly adapted for digital implementation in a cable television converter, and capable of recovering desired baseband video signals with minimum distortion.

These and other objects of the present invention will become apparent hereinafter.

SUMMARY OF INVENTION

According to one of the broader aspects of the present invention, a method and apparatus are provided for recovering a desired baseband signal from a signal having in-phase and quadrature-phase signal components (i.e. carrier signals), while automatically correcting phase error present between these signal components.

In general, the method of the present invention involves providing to the input of a local signal generating circuit, a first signal representative of the in-phase carrier signal, and generating local in-phase and quadrature-phase signals. One of the local in-phase and quadrature-phase signals is phase shifted by a selected amount of phase correction. The local in-phase signal is multiplied by the first signal to produce a first resultant signal. The local quadrature-phase signal is multiplied by the second signal representative of the quadrature-phase carrier signal, to produce a second resultant signal. The first resultant signal and the second resultant signal are then summed so as to produce an output signal representative of the desired baseband signal.

In a preferred embodiment, the method of the present invention is carried out in a quadrature demodulator which is implemented as a digital signal processor. In such an embodiment, the local signal generating circuit is a phase-locked loop circuit, and the method is repeatedly performed in a cyclical manner, so that the amount of phase correction is incrementally adjusted until the introduced phase correction substantially equals the actual phase error present between the I and Q signal components. Using conventional technology, very short phase-error correction times can be achieved, while resulting in minimum distortion of demodulated baseband signals.

A variety of signal processors are disclosed for carrying out the method of the present invention. In each embodiment., the incremental amounts of selected phase correction are computed using a trigonometric relation including one or more signals sensed along the I and Q channels of the signal processor.

BRIEF DESCRIPTION OF THE DRAWINGS

For a further understanding of the objects of the present invention, the Detailed Description of the Illustrated Embodiments is to be described in connection with the following drawings, in which.

DETAILED DESCRIPTION OF THE ILLUSTRATED EMBODIMENTS

Figure 2:
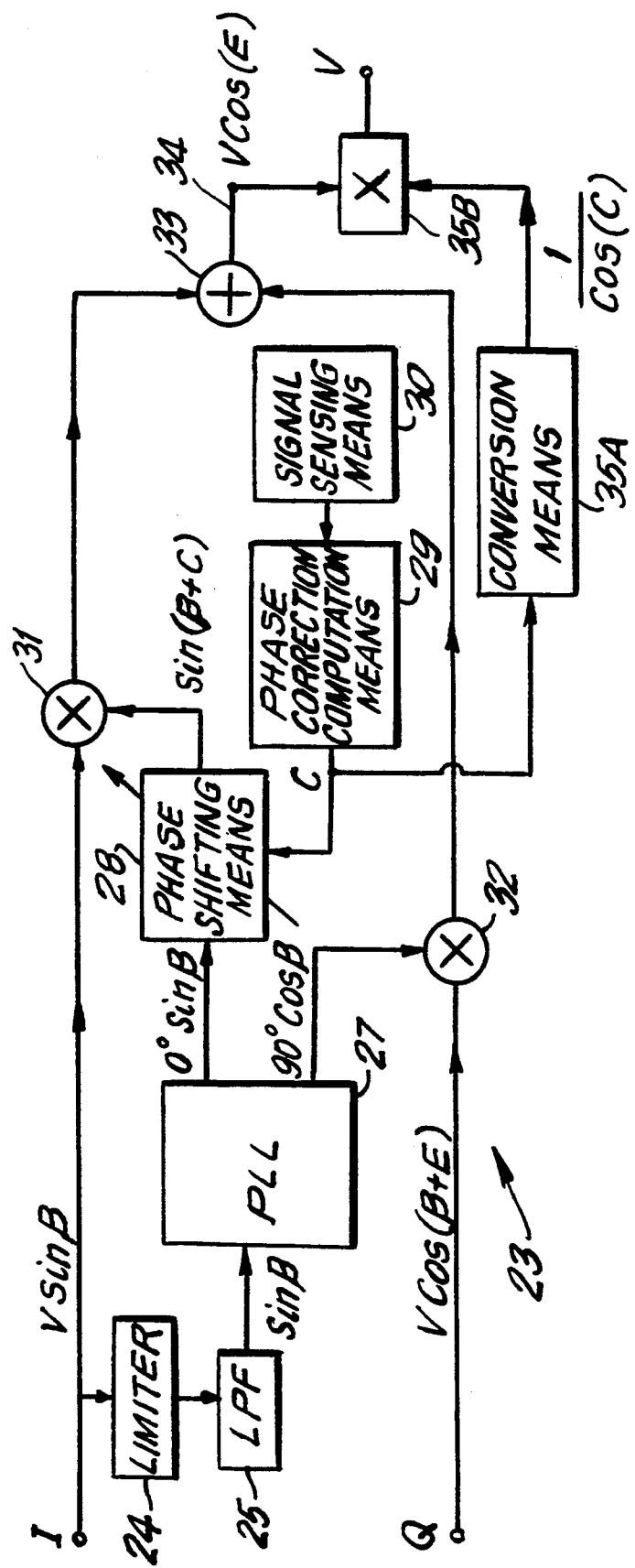
FIG. 2 is a block functional diagram illustrating a signal processor for recovering a desired baseband signal using the method of phase-error correction according to the present invention.

FIG. 2 provides a schematic representation of a quadrature demodulator 23 for demodulating a desired baseband signal carried by detected I and Q signal components (i.e. carrier signals). In general, the desired baseband signal is carried by both the I and the Q signal components.

Figure 1:
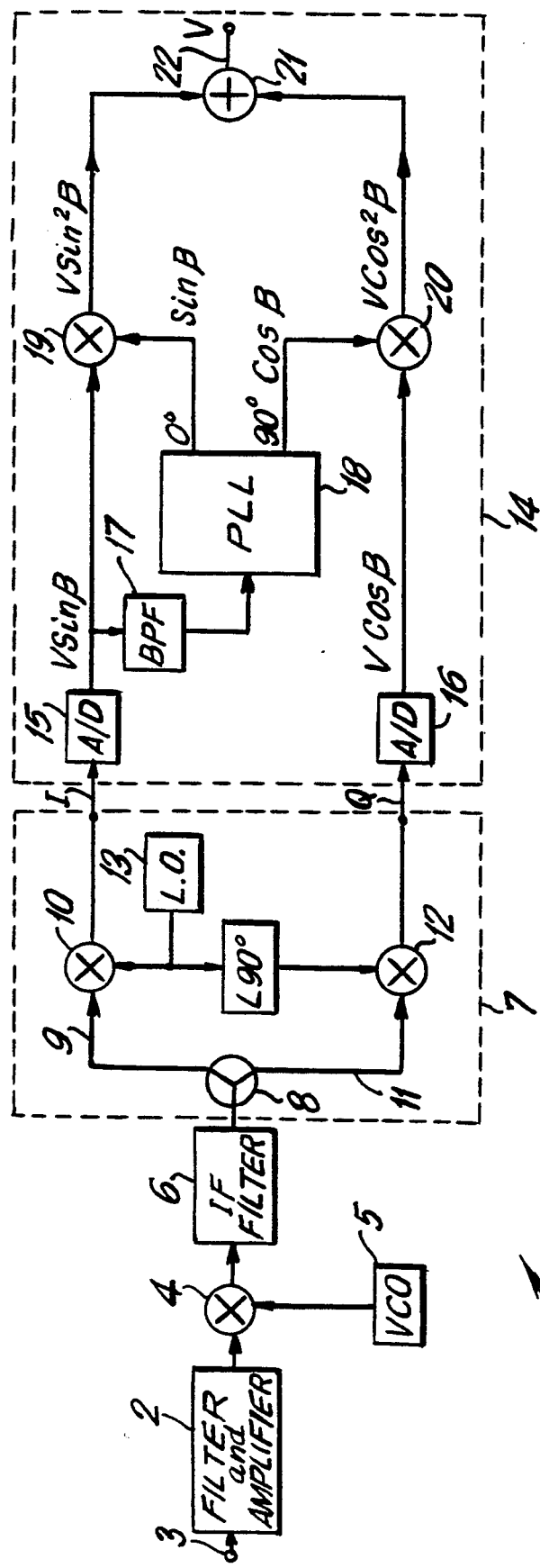
FIG. 1 is a block diagram of a prior art homodyne receiver for use in cable television converter or other applications.

In the illustrated embodiment, quadrature demodulator 23 is realized as a signal processor which is operably associatable with a homodyne mixer of the type disclosed, for example, in FIG. 1. As illustrated, the I and Q signal components are provided to the in-phase and quadrature channels of the processor, respectively. It is understood that the concept of "in-phase" and "quadrature-phase" are relative terms and as such, what is significant is that there exists an orthogonal relationship between the signal carrier pair. Otherwise, the signals represented by these terms can be interchanged with essentially equivalent results.

As shown, the in-phase signal component is expressed as $V\sin\beta$, where $\beta = (\Omega_{LO} - \Omega_C)t$, $\Omega_C$ is the frequency of the local oscillator of the homodyne mixer, and $\Omega_C$ is the intermediate frequency. In order to represent relative phase error present between the I and Q signal components, the quadrature phase signal component is expressed as $V\cos(\beta + E)$, where E represents the phase error present between the I and Q signal components. Notably, however, as the phase error is relative to the I and Q signal components, the phase error can be modelled as being present along the in-phase signal channel with essentially equivalent results.

The I signal component $V\sin\beta$ is passed through a limiter circuit 25, which outputs the signal SinB. This signal is subsequently passed through low-pass filter 26. The output of low pass filter 26 is coupled to the input of a local signal generating circuit 27 that generates 0° and 90° components (i.e. local in-phase and quadrature-phase components) corresponding to $\sin(\beta)$ and $\cos(\beta)$. In the illustrated embodiment, local signal generating circuit 27 is a phase-locked loop circuit which precisely locks onto the incoming 2.15 MHz signal and generates the local in-phase and quadrature-phase components, $\sin(\beta)$ and $\cos(\beta)$. It is understood, however, that in other embodiments, local signal generating circuit 27 may be realized using an active or passive (e.g. LC or RC) network for generating local in-phase quadrature-phase signal components $\sin(\beta)$ and $\cos(\beta)$.

The local in-phase signal component $\sin(\beta)$ is provided as input to variable phase-shifting circuit 28 so as to phase shift (i.e. advance or delay) this signal by a selected amount of phase correction "C" and thereby produce as output, a phase-shifted local in-phase signal component expressed by $\sin(\beta + C)$. As discussed above, in alternative embodiments, this phase shift can be introduced along the local quadrature-phase local signal $\cos(\beta)$, with essentially equivalent results. As will be described in greater detail hereinafter, the selected amount of phase correction C is derived in real-time by phase-correction computation circuit 29 using (i) a trigonometric relation and (ii) input signals which are sensed within the signal processor by signal sensing apparatus 30 well known in the art.

As shown in FIG. 2, the in-phase signal component $V\sin(\beta)$ is multiplied (i.e. mixed) in mixer 31 with the phase-shifted local in-phase signal $\sin(\beta + C)$ to produce a first product signal $V\sin(\beta)\sin(\beta + C)$. Using known trigonometric relations, first product signal $V\sin(\beta)\sin(\beta + C)$ can be expressed as $\sin^2(\beta)\cos(C) + \sin(\beta)\cos(\beta)\sin(C)$.

Similarly, the quadrature-phase signal component $V\cos(\beta + E)$ is multiplied in mixer 32 with local quadrature-phase signal component $\cos(\beta)$ to produce a second product signal $V\cos(\beta + E)\cos(\beta)$. Using again well known trigonometric relations, second product signal $V\cos(\beta + E)\cos(\beta)$ can be expressed as $\cos^2(\beta)\cos(E) - \sin(\beta)\cos(\beta)\sin(E)$.

If the selected amount of phase correction C is incrementally adjusted to equal the amount of phase error present between the I and Q signal components, then when first and second product signal components from mixers 31 and 32 are added together in summing circuit 33, the resultant output signal on terminal 34 will be VCos(E). This resultant output signal represents the recovered desired baseband signal V without harmonic distortion, but with a small amplitude error represented by the term Cos(E). Typically, the phase correction process will require a small number of incremental adjustments in phase shift (i.e. in digital implementations), until the introduced phase correction E equals the actual phase error C and the baseband signal is acquired without distortion.

As shown in FIG. 2, the amplitude error term Cos (E) at output 34 can be corrected by an error correction circuit comprising conversion unit 35A and multiplier 35B, as shown. In operation, the phase-error correction amount C, which will be essentially equivalent to phase-error E, is provided to conversion unit 35A, as shown. Conversion unit 35A realized as an computational unit or a look-up table, receives phase-error correction signal C and generates an output signal represented by 1/Cos(C). Then, when the resultant output signal VCos(E) on terminal 34 is multiplied by output signal 1/Cos(C) in multiplier 35B, the amplitude-corrected output signal produced from multiplier 35B is expressed by:

$$VCos(E) \cdot \frac{1}{Cos(E)} \approx V$$

Notably, since the amount of introduced phase-error correction C is essentially equal to the amount of phase-error E, the amplitude distortion is effectively eliminated.

Figure 3:
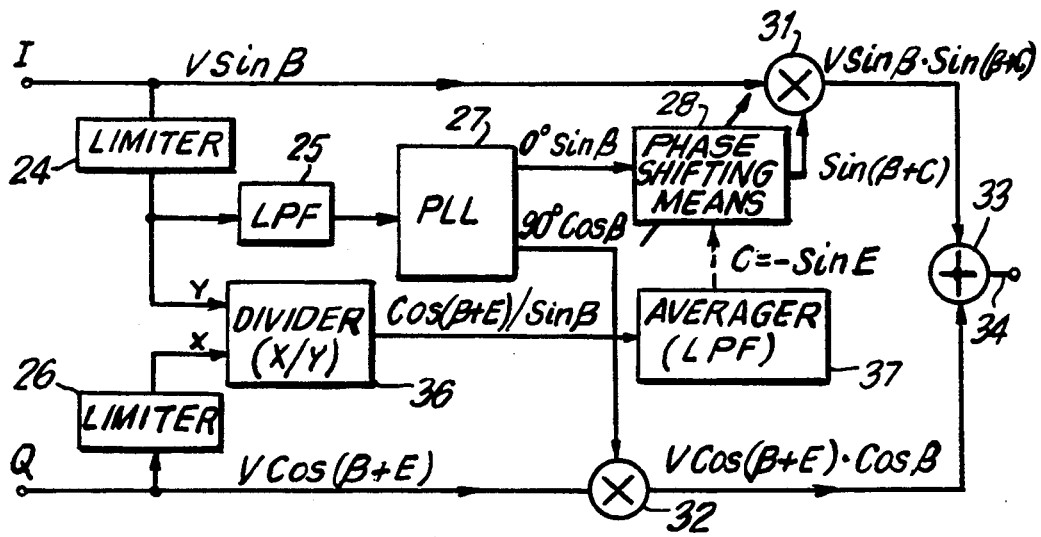
FIG. 3 is a first embodiment of the signal processor according to the present invention.

In FIG. 3, a first embodiment of the signal processor of the present invention is shown. In this embodiment, the amount of phase correction introduced to local in-phase signal component Sin($\beta$) is derived by sensing signals Sin($\beta$) and Cos($\beta$+E) output from limiter circuits 24 and 26, respectively, and processing these signals according to a trigonometric relation involving the sensed signals. Specifically, quadrature phase signal component Cos($\beta$+E) is provided as one input to a divider circuit 36, while in-phase signal component Sin($\beta$) is provided as the other input to the divider circuit. The output of divider circuit 36 is the ratio of the quadrature-phase signal to the in-phase signal, that is quotient signal Cos($\beta$+E)/Sin($\beta$). Applying the trigonometric relation Cos($\beta$+E)=Cos($\beta$)Cos(E)−Sin($\beta$)Sin(E), this quotient signal can be represented by Cotan($\beta$)Cos(E)−Sin(E). This quotient signal is then provided as input to an averaging circuit 37 realized for example, as a low pass filter, which eliminates the AC component Cotan($\beta$)Cos(E) and produces as output the DC component Sin(E). This DC component, representative of a selected amount of phase correction, can be either calculated or found in a look-up table in digital implementations, and then used to incrementally adjust in real-time the phase shifting circuit 28 to introduce an equivalent amount of phase shift required for phase correction within the signal processor circuit.

Figure 4:
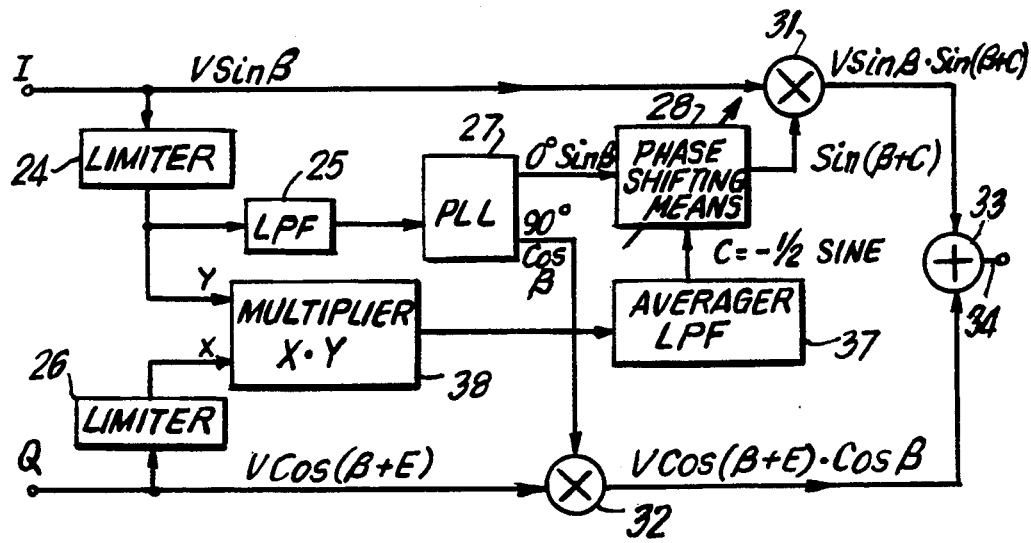
FIG. 4 is a second embodiment of the signal processor according to the present invention.

In FIG. 4, a second embodiment of the signal processor of the present invention is shown. In this embodiment, the amount of phase correction to local in-phase local signal component Sin($\beta$) is also derived by sensing signals Sin($\beta$) and Cos($\beta$+E) from limiter circuits 24 and 26, respectively, and processing these signals according to a trigonometric relation involving the sensed signals. Specifically, in this embodiment, signals Sin($\beta$) and Cos($\beta$+E) are provided as input to a multiplier circuit 38, which produces as output a product signal Sin($\beta$)Cos($\beta$+E). Applying the trigonometric relation Cos($\beta$+E)=Cos($\beta$)Cos(E)−Sin($\beta$)Sin(E), this product signal can be represented by Sin$\beta$ [Cos($\beta$) Cos(E)−Sin($\beta$) Sin(E)], which after expansion and application of other known trigonometric relations, can be expressed as:

−½ Sin (E)+½[Sin (2$\beta$) Cos (E)+Cos (2$\beta$) Sin (E)]

Notably, the first term in the above expression represents a DC component, whereas the second set of terms represents AC components present in the product signal Cos($\beta$)Cos($\beta$+E). By low pass filtering (e.g. through averaging), the AC components are selectively eliminated, yielding the DC term −½Sin(E) as the selected amount of phase shift required for phase correction within the signal processor.

Figure 5:
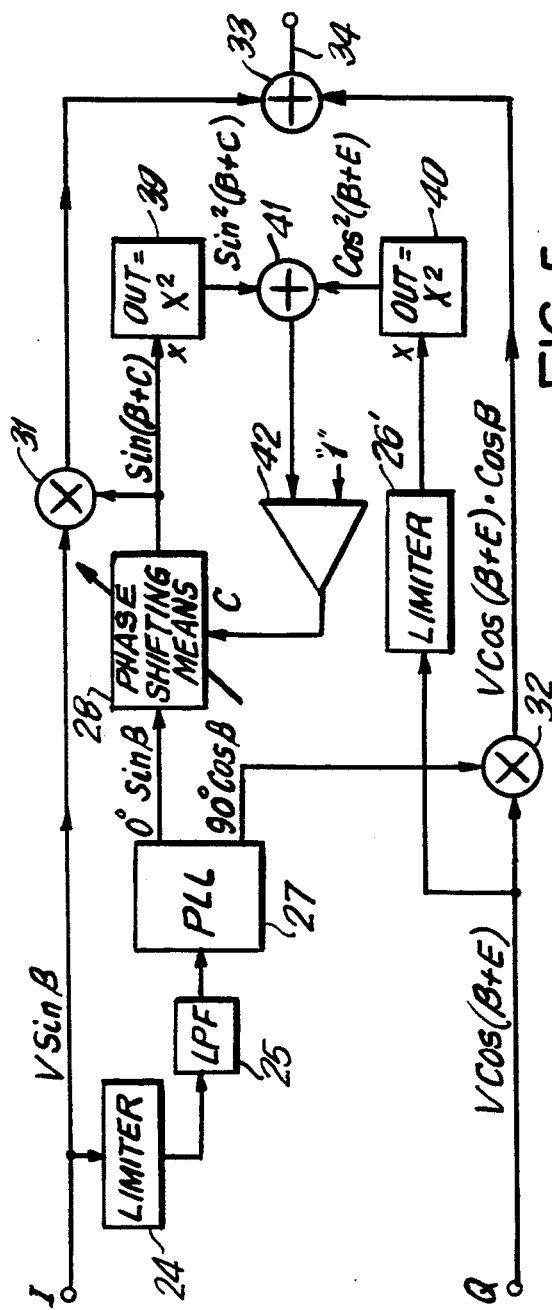
FIG. 5 is a third embodiment of the signal processor according to the present invention.

In FIG. 5, a third embodiment of the signal processor of the present invention is shown. In this embodiment, the amount of phase correction introduced to local in-phase signal component Sin($\beta$) is derived by sensing quadrature-phase signal cos($\beta$+E) from limiter circuit 26' and the phase-shifted local in-phase signal Sin($\beta$+C) from phase-shifting circuit 28 and processing these signals according to a trigonometric relation involving the sensed signals. Specifically, phase-shifted local in-phase signal Sin($\beta$+C) from phase shifting circuit 28 is provided to the input of a first squaring circuit 39 to produce a first squared signal Sin$^2$($\beta$+C). Also, quadrature-phase signal Cos($\beta$+E) is provided to the input of a second squaring circuit to produce a second squared signal Cos Z ($\beta$+E). First and second squared signals are provided to the input of a summing circuit 41 to produce as output a sum signal equal to Sin($\beta$+C)+Cos($\beta$+E). Applying the trigonometric relation Sin$^2$($\beta$) +Cos$^2$($\beta$)=1, this sum signal is then compared against the numerical value "1" within a comparator circuit 42, whose output incrementally adjusts (i.e. increases or decreases) the selected amount of phase correction introduced by phase-shifter circuit 28, until the sum signal from summing circuit 41 substantially equals the numerical value "1". When this relation holds, then the amount of phase shift introduced is sufficient to achieve phase correction within the signal processor.

Figure 6:
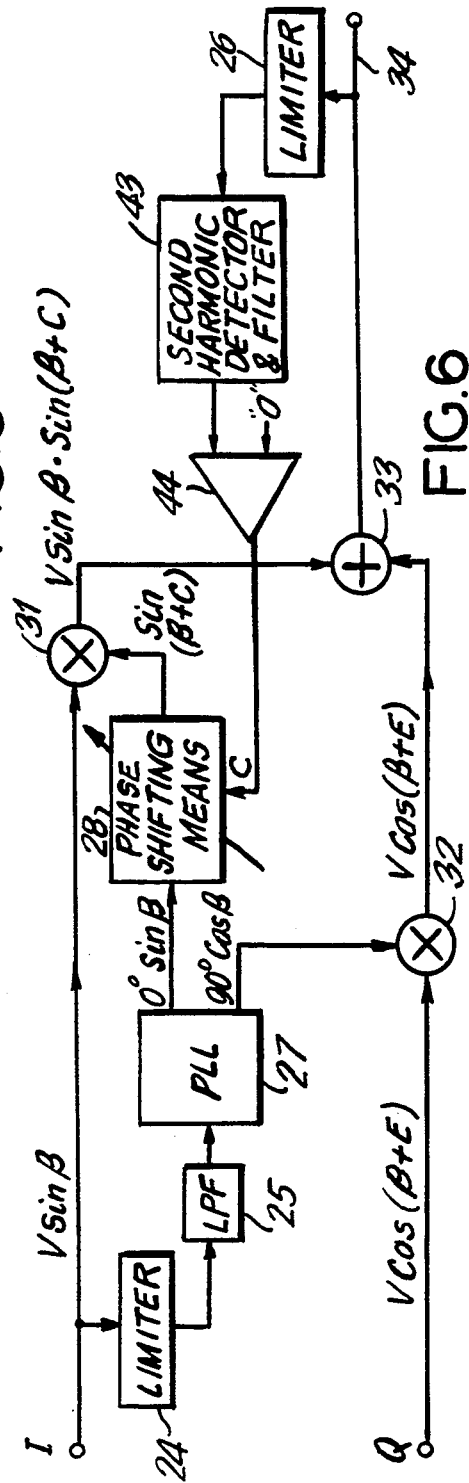
FIG. 6 is a fourth embodiment of the signal processor according to the present invention.

In FIG. 6, a fourth embodiment of the signal processor of the present invention is shown. In this embodiment, the amount of phase correction introduced to local in-phase signal component Sin($\beta$) is derived by sensing from limiter circuit 26'', the limited output signal from summing circuit 33, and processing this sensed signal according to a trigonometric relation involving this sensed signal. Specifically, applying trigonometric relations Sin($\beta$+C)=Sin($\beta$)Cos(C)+Sin(C)Bos($\beta$) and Cos($\beta$+E)=Cos($\beta$)Cos(E)−Sin($\beta$)Sin(E), this resultant output signal can be expressed as:

Sin$^2$($\beta$) Cos (C)+Sin ($\beta$) Cos ($\beta$) Sin (C)+Cos$^2$($\beta$) Cos (E)−Sin ($\beta$) Cos ($\beta$) Sin (E)

Alternatively, this output signal can be expressed as:

½[cos (C)+cos (E)−cos (2$\beta$)[cos (E)−cos (E)]+Sin (2$\beta$)[cos (C)+Cos (E)]]

in which the DC term is represented by ½[cos(C)+cos(E)] and the second harmonic term can be expressed as:

½[Sin (2β)[Sin (C)−Sin (E)]−Cos (2β)[cos (C)−Cos (E)]].

As indicated by the above expression, the second harmonic terms of the carrier are eliminated when Sin(C)=Sin(E). Thus, by ensuring C=E, the second harmonic terms are eliminated and consequently phase error in the system corrected.

In order to eliminate the second harmonic terms from the output signal, the selected amount of phase shift C is adjusted to substantially equal the actual phase error E present between the I and Q signal components provided to the signal processor. As illustrated in FIG. 6, this condition can be satisfied by providing the resultant output signal to a second harmonic detector and filter 43 which detects and passes only the second harmonic signal components having a frequency of 2β. The output of second harmonic filter 43 is then compared against the numerical value "0" within a comparator circuit 44. Comparator circuit 44 adjusts the selected amount of phase correction introduced by phase-shifting circuit 28, until the second harmonic signals are minimized to the numerical value "0".

In a preferred embodiment, the method of the present invention is carried out in a quadrature demodulator which is implemented as a digital signal processor. This will require utilization of an A/D converter along each of the I and Q signal channels of the signal processor, in a manner which will be readily apparent to those skilled in the art.

The method of phase correction according to the present invention has been described above in connection with amplitude modulated signals. Expectedly, however, the method of correcting phase error between in-phase and quadrature-phase signal components may also be applied to frequency and phase modulated carrier signals alike, during the recovery of desired baseband signals.

While the particular embodiments shown and described above will be useful in many applications in the television signal processing art, further modifications of the present invention will occur to persons with ordinary skill in the art. All such modifications are deemed to be within the scope and spirit of the present invention defined by the appended claims.

What is claimed is:

1. A method of recovering a desired baseband signal from a signal represented by in-phase and quadrature-phase signal components between which phase error is present, said method comprising the steps:
    (a) deriving a first signal representative of said in-phase signal component and deriving a second signal representative of said quadrature phase signal component;
    (b) producing quotient signal using said first and second signals, and averaging said quotient signal to produce a selected amount of phase correction;
    (c) providing said first signal to an input of a local signal producing circuit, and producing therefrom a local in-phase signal and a local quadrature-phase signal;
    (d) phase shifting either said local in-phase signal or said quadrature-phase signal by said selected amount of phase correction to produce either a phase-shifted local in-phase signal or a phase-shifted local quadrature-phase signal, respectively;
    (e) producing a first resultant signal using said in-phase signal component and either said phase-shifted local in-phase signal or said local in-phase signal, and producing a second resultant signal using said quadrature-phase signal component and either said local quadrature-phase signal or said phase-shifted local quadrature-phase signal, respectively; and
    (f) summing said first resultant signal and said second resultant signal so as to produce an output signal representative of said desired baseband signal.

2. The method of claim 1, wherein step (c) comprises providing said first signal to an input of a phase-locked loop circuit and producing therefrom said local in-phase signal and said local quadrature-phase signal.

3. A method of recovering a desired baseband signal from a signal represented by in-phase and quadrature-phase signal components between which phase error is present, said method comprising the steps:
    (a) deriving a first signal representative of said in-phase signal component, and deriving a second signal representative of said quadrature-phase signal component;
    (b) providing said first signal to an input of a local signal producing circuit, and producing therefrom a local in-phase signal and a local quadrature-phase signal;
    (c) multiplying said first signal and said second signal to produce a product signal, and averaging said product signal so as to produce a selected amount of phase correction;
    (d) phase shifting either said local in-phase signal or said quadrature-phase signal by said selected amount of phase correction so as to produce either a phase shifted local in-phase signal or a phase-shifted local quadrature-phase signal, respectively;
    (e) producing a first resultant signal using said in-phase signal component and either said phase-shifted local in-phase signal or said local in-phase signal, and producing a second resultant signal using said quadrature-phase signal component and either said local quadrature-phase signal or said phase-shifted local quadrature-phase signal, respectively; and
    (f) summing said first resultant signal and said second resultant signal so as to produce an output signal representative of said desired baseband signal.

4. The method of claim 3, wherein steps (a) through (f) are repeated in a cyclical manner a number of times and during step (c) said selected amount of phase correction is either incrementally increased or decreased in a direction so phase error is reduced to zero.

5. A method of recovering a desired baseband signal from a signal represented by in-phase and quadrature-phase signal components between which phase error is present, said method comprising the steps:
    (a) deriving a first signal representative of said in-phase signal component and deriving a second signal representative of said quadrature-phase signal component;
    (b) providing said first signal to an input of an local signal producing circuit, and generating therefrom a local in-phase signal and a local quadrature-phase signal;
    (c) squaring said local in-phase signal or quadrature-phase signal to produce a first product signal and squaring said first signal to produce a second product signal;

(d) summing said first product signal and said second product signal to produce a sum signal;

(e) comparing said sum signal to the value 1 and producing a selected amount of phase correction so that said sum signal substantially equals the numerical value 1;

(f) phase shifting either said local in-phase signal or said quadrature-phase signal by said selected amount of phase correction so as to produce either a phase shifted local in-phase signal or a phase-shifted local quadrature-phase signal, respectively;

(g) producing a first resultant signal using said in-phase signal component and either said phase-shifted local in-phase signal or said local in-phase signal, and producing a second resultant signal using said quadrature-phase signal component and either said local quadrature-phase signal or said phase-shifted local quadrature-phase signal, respectively; and (h) summing said first resultant signal and said second resultant signal so as to produce an output signal representative of said desired baseband signal.

6. The method of claim 5, wherein step (b) comprises providing said first signal to an input of a phase-locked loop circuit and generating therefrom said local in-phase signal and said local quadrature-phase signal.

7. The method of claim 5, wherein steps (a) through (h) are repeated in a cyclical manner a number of times and during step (e) said selected amount of phase correction is either incrementally increased or decreased in a direction so that said phase error is reduced to substantially zero.

8. A method of recovering a desired baseband signal from a signal represented by in-phase and quadrature-phase signal components between which phase error is present, said method comprising the steps:

(a) deriving a first signal representative of said in-phase signal component, and deriving a second signal representative of said quadrature-phase signal component;

(b) providing said first signal to the input of a local signal producing circuit, and producing therefrom a local in-phase signal and a local quadrature-phase signal;

(c) phase shifting either said local in-phase signal or said quadrature-phase signal by a selected amount of phase correction so as to produce either a phase shifted local in-phase signal or a phase-shifted local quadrature-phase signal, respectively;

(d) producing a first resultant signal using said in-phase signal component and either said phase-shifted local in-phase signal or said local in-phase signal, and producing a second resultant signal using said quadrature-phase signal component and either said local quadrature-phase signal or said phase-shifted local quadrature-phase signal, respectively;

(e) summing said first resultant signal and said second resultant signal so as to produce an output signal representative of said desired baseband signal and having a second harmonic;

(f) extracting the second harmonic signal from said output signal; and (g) comparing said second harmonic signal to the value 0 and adjusting said selected amount of phase correction using either said phased-shifted local in-phase signal or said phase-shifted local quadrature-phase signal so that said second harmonic is minimized.

9. The method of claim 8, wherein steps (a) through (g) are repeated in a cyclical manner a number of times and during step (g) said selected amount of phase correction is either incrementally increased or decreased in a direction so that said phase error is reduced to substantially zero.

10. The method of claim 8, wherein step (b) comprises providing said first signal to the input of a phase-locked loop circuit and producing therefrom said local in-phase signal and said local quadrature-phase signal.

11. A method of recovering a desired baseband signal from a signal represented by in-phase and quadrature-phase signal components between which phase error is present, said method comprising the steps:

(a) deriving a first signal representative of said in-phase signal component, and a second signal representative of said quadrature-phase signal component;

(b) providing said first signal to the input of a local signal producing circuit, and producing therefrom a local in-phase signal and a local quadrature-phase signal;

(c) phase shifting either said local in-phase signal or said quadrature-phase signal by a selected amount of phase correction so as to produce either a phase shifted local in-phase signal or a phase-shifted local quadrature-phase signal, respectively;

(d) producing a first resultant signal using said in-phase signal component and either said phase-shifted local in-phase signal or said local in-phase signal, and producing a second resultant signal using said quadrature-phase signal component and either said local quadrature-phase signal or said phase-shifted local quadrature-phase signal, respectively; and (e) summing said first resultant signal and said second resultant signal so as to produce an output signal representative of said desired baseband signal, wherein said selected amount of phase correction is produced by sensing at least one signal selected only from the group comprising said first signal, said second signal, said local in-phase signal, said local quadrature-phase signal and said output signal, and by directly processing said at least one sensed signal in accordance with at least one trigonometric relation involving said at least one sensed signal.

12. The apparatus of claim 11, wherein said local signal producing circuit comprises a phase-locked loop circuit.

13. Apparatus for recovering a desired baseband signal from a signal represented by in-phase and quadrature-phase signal components between which phase error is present, said apparatus comprising:

a local signal producing circuit, including first means for producing a first signal representative of said in-phase signal component and a second signal representative of said quadrature-phase signal component, and second means, responsive to either said first signal or said second signal, for producing a local in-phase signal and a local quadrature-phase signal;

signal processing means for producing quotient signal using said first and second signals, and averaging said quotient signal so as to produce a selected amount of phase correction;

phase shifting means for receiving either said local in-phase signal or said quadrature-phase signal from said local signal producing circuit, and phase shifting either said local in-phase signal or said quadrature-phase signal by said selected amount of phase correction so as to produce either a phase shifted local in-phase signal or a phase-shifted local quadrature-phase signal, respectively;

signal producing means for producing a first resultant signal;

using said in-phase signal component and either said phase-shifted local in-phase signal or said local in-phase signal, and producing a second resultant signal using said quadrature-phase signal component and either said local quadrature-phase signal or said phase-shifted local quadrature-phase signal, respectively; and signal summing means for summing said first resultant signal and said second resultant signal so as to produce an output signal representative of said desired baseband signal.

14. The apparatus of claim 13, wherein said local signal producing circuit comprises a phase-locked loop circuit.

15. Apparatus for recovering a desired baseband signal from a signal represented by in-phase and quadrature-phase signal components between which phase error is present, said apparatus comprising:

a local signal producing circuit, including
first means for producing a first signal representative of said in-phase signal component, and a second signal representative of said quadrature-phase component, and
second means, responsive to either said first signal or said second signal for producing a local in-phase signal and a local quadrature-phase local signal;

signal processing means for multiplying said first signal and said second signal so as to produce a product signal, and averaging said product signal so as to produce a selected amount of phase correction;

phase shifting means for receiving either said local in-phase signal or said quadrature-phase signal from said local signal producing circuit, and phase-shifting either said local in-phase signal or said quadrature-phase signal by said selected amount of phase correction so as to produce either a phase shifted local in-phase signal or a phase-shifted local quadrature-phase signal, respectively;

signal producing means for producing a first resultant signal;

using said in-phase signal component and either said phase-shifted local in-phase signal or said local in-phase signal, and producing a second resultant signal using said quadrature-phase signal component and either said local quadrature-phase signal or said phase-shifted local quadrature-phase signal, respectively; and signal summing means for summing said first resultant signal and said second resultant signal so as to produce an output signal representative of said desired baseband signal.

16. Apparatus for recovering a desired baseband signal from a signal represented by in-phase and quadrature-phase signal components between which phase error is present, said apparatus comprising:

a local signal producing circuit, including
first means for producing a first signal representative of said in-phase signal component and a second signal representative of said quadrature-phase signal component, and
second means, responsive to either said first signal or said second signal, for producing a local in-phase signal and a local quadrature-phase local signal;

signal processing means including
means for squaring said second signal to produce a first product signal,
means for squaring one of said local in-phase and quadrature-phase signals to produce a second product signal,
means for summing said first product signal and said second product signal to produce a sum signal, and
means for comparing said sum signal to the value 1 and producing a selected amount of phase correction so that said sum signal substantially equals the numerical value 1;

phase shifting means for receiving either said local in-phase signal or said quadrature phase signal from said local signal producing circuit, and phase-shifting either said local in-phase signal or said quadrature-phase signal by said selected amount of phase correction so as to produce either a phase shifted local in-phase signal or a phase-shifted local quadrature-phase signal, respectively;

signal producing means for producing a first resultant signal
using said in-phase signal component and either said phase-shifted local in-phase signal or said local in-phase signal and producing a second resultant signal using said quadrature-phase signal component and either said local quadrature-phase signal or said phase-shifted local quadrature,phase signal, respectively; and signal summing means for summing said first resultant signal and said second resultant signal so as to produce an output signal representative of said desired baseband signal.

17. The apparatus of claim 16, wherein said local signal producing circuit comprises a phase-locked loop circuit.

18. Apparatus for recovering a desired baseband signal from a signal represented by in-phase and quadrature-phase signal components between which phase error is present, said apparatus comprising:

a local signal producing circuit, including
first means for producing a first signal representative of said in-phase signal component and a second signal representative of said quadrature-phase signal component, and
second means, responsive to either said first signal or said second signal, for producing a local in-phase signal and a local quadrature-phase signal;

phase shifting means for receiving either said local in-phase signal or said local quadrature-phase signal from said local signal producing circuit, and phase-shifting either said local in-phase signal and quadrature-phase signal by a selected amount of phase correction so as to produce either a phase shifted local in-phase signal or a phase-shifted local quadrature-phase signal, respectively;

signal producing means for producing a first resultant signal using said in-phase signal component and either said phase-shifted local in,phase signal or said local in-phase signal, and producing a second resultant signal using said quadrature-phase signal component and either said local quadrature-phase signal or said phase-shifted quadrature-phase signal respectively;

signal summing means for said first resultant signal and said second resultant signal so as to produce an output signal representative of said desired baseband signal and having a second harmonic; and signal processing means including means for extracting the second harmonic from said output signal, and means for comparing said second harmonic to the value 0 and adjusting said selected amount of phase correction using either said phase-shifted local in-phase signal or said phase-shifted local quadrature-phase signal, so that said second harmonic is substantially minimized.

19. The apparatus of claim 18, wherein said local signal producing circuit comprises a phase-locked loop circuit.

20. The apparatus of claim 18, wherein said local signal producing circuit comprises a phase-locked loop circuit.

21. Apparatus for recovering a desired baseband signal from a signal represented by in-phase and quadrature-phase signal components between which phase error is present, said apparatus comprising:

a local signal producing circuit including first means for producing a first signal representative of said in-phase signal component, and a second signal representative of said quadrature-phase signal component, and second means, responsive to either said first signal or said second signal, for producing a local in-phase signal and a local quadrature-phase local signal;

phase shifting means for receiving either said local in-phase signal or said quadrature-phase signal from said local signal producing circuit, and phase shifting either said local in-phase signal or said quadrature-phase signal by a selected amount of phase correction so as to produce either a phase shifted local in-phase signal or a phase-shifted local quadrature-phase signal, respectively;

signal producing means for producing a first resultant signal using said in-phase signal component and either said phase-shifted local in-phase signal or said local in-phase signal, and producing a second resultant signal using said quadrature-phase signal component and either said local quadrature-phase signal or said phase-shifted local quadrature-phase signal, respectively; and signal summing means for said first resultant and said second resultant signal so as to produce an output signal representative of said desired baseband signal, wherein said selected amount of phase correction is produced by sensing at least one signal selected from the group comprising of said first signal, said second signal, said local in-phase signal, said local quadrature-phase signal and said output signal, and by directly processing said at least one said sensed signal in accordance with at least one trigonometric relation involving said at least one said sensed signal.

* * * * *